(12) United States Patent  
Gross (10) Patent No.: US 7,271,026 B2  
(45) Date of Patent: Sep. 18, 2007

(54) METHOD FOR PRODUCING CHIP STACKS AND CHIP STACKS FORMED BY INTEGRATED DEVICES

(75) Inventor: Harald Gross, Dresden (DE)

(73) Assignee: Infineon Technologies AG, Munich (DE)

( * ) Notice: Subject to any disclaimer, the term of this patent is extended or adjusted under 35 U.S.C. 154(b) by 89 days.

(21) Appl. No.: 11/079,620

(22) Filed: Mar. 14, 2005

(65) Prior Publication Data

US 2006/0205111 A1 Sep. 14, 2006

(51) Int. Cl.
- H01L 21/44 (2006.01)
- H01L 21/48 (2006.01)
- H01L 21/50 (2006.01)

(52) U.S. Cl. ...................... 438/106; 257/620

(58) Field of Classification Search ............... 438/199, 438/233, 275, 585, 926, 106, 110, 113; 257/620, 257/626, 686

See application file for complete search history.

(56) References Cited

U.S. PATENT DOCUMENTS

| | | | |
|---|---|---|---|
| 2005/0139985 A1 * | 6/2005 | Takahashi | 257/698 |
| 2005/0179127 A1 * | 8/2005 | Takyu et al. | 257/724 |
| 2006/0157866 A1 | 7/2006 | Le et al. | |
| 2006/0202317 A1 | 9/2006 | Barakat et al. | |

* cited by examiner

Primary Examiner—Phuc T. Dang  
(74) Attorney, Agent, or Firm—Patterson & Sheridan, L.L.P.

(57) ABSTRACT

The method of the present invention relates to a method for producing a chip stack comprising the steps of manufacturing at least a first and a second integrated structure on a single substrate, an area of the first integrated structure and an area of the second integrated structure adjoining a respective first and second kerf area; providing a first redistribution layer on the first integrated structure on the substrate, said first redistribution layer at least partially extending beyond the area of the first integrated structure into the first kerf area, thereby forming a first integrated device area, wherein a first contact pad is arranged on the first redistribution layer in a first contacting area overlapping the first kerf area; providing a second redistribution layer on a second integrated structure on the substrate, including a second contact pad, thereby forming a second integrated device area; separating the first and second integrated device areas along a separation line defined by at least one of the boundaries of the first integrated device area and the second integrated device area, resulting in separated first and second integrated devices; and stacking the second integrated device on the first integrated device so that the first contacting pattern is uncovered by the second integrated device.

23 Claims, 5 Drawing Sheets

METHOD FOR PRODUCING CHIP STACKS AND CHIP STACKS FORMED BY INTEGRATED DEVICES

CROSS-REFERENCE TO RELATED APPLICATIONS

This application is related to U.S. patent application Ser. No. 11/039,293, entitled SIGNAL REDISTRIBUTION USING BRIDGE LAYER FOR MULTICHIP MODULE, filed Jan. 20, 2005, by Thoai Thai Le et al., and U.S. patent application Ser. No. 11/208,362, entitled METHOD FOR MCP PACKAGING FOR BALANCED PERFORMANCE, filed Mar. 14, 2005, by Farid Barakat et al. Each of the aforementioned related patent applications is herein incorporated by reference in its entirety.

BACKGROUND OF THE INVENTION

1. Field of the Invention

The present invention relates to a method for producing chip stacks and to chip stacks formed by stacked integrated devices.

2. Description of the Related Art

In order to further reduce the size of integrated systems, integrated devices, e.g., chips are arranged in stacks. Each of the integrated devices comprises contact pads thereon which are bonded to a system PCB (printed circuit board). In between the integrated device chips, an insulating spacer has to be provided to enable the bond wire to contact the contact pads and to avoid shortcuts with the respective upper integrated device chip.

Particularly for integrated device chips with a small thickness, e.g. below 100 µm, the stack height is therefore dominated by the thickness of the spacer. In addition, the handling and the assembly of the integrated device stack is more challenging if the stack height is increased due to the provision of the spacers compared to stacks that do not comprise spacers. Also, the length of the bond wires is higher in a chip stack having spacers than in a chip stack without spacers which leads to a reduced electrical performance of the chip stack system. Furthermore, the thermal resistance of an integrated device stack having spacer in the integrated device chips is increased.

Moreover, conventional integrated device stacks are prone to produce electrical shorts of the bond wires while applying the spacer material and while positioning an integrated device onto the spacer material. This reduces reliability and yield of production.

SUMMARY OF THE INVENTION

Therefore, one embodiment of the present invention provides a method for producing chip stacks wherein the provision of spacers as a distancing element between two stacked integrated devices can be avoided.

Furthermore, another embodiment of the present invention provides a method for producing chip stacks wherein the manufacturing of chip stacks can be facilitated.

A further embodiment of the present invention provides a chip stack with a reduced height which can be produced less expensively, the production time is reduced and the production yield is increased.

Yet another embodiment of the present invention provides a chip stack wherein the thermal resistance between the integrated devices is reduced.

According to a first aspect of the present invention, a method for producing a chip stack is provided. The method comprises the step of manufacturing at least a first and a second integrated structure on a single substrate, an area of the first integrated structure and an area of the second integrated structure adjoining a respective first and second kerf area; the step of providing a first redistribution layer on the first integrated structure on the substrate, the redistribution layer at least partially extending beyond the area of the first integrated structure into the first kerf area, thereby forming a first integrated device area, wherein a first contacting pattern (contact pad) is arranged on the first redistribution layer in a first contacting area overlapping the first kerf area; the step of providing a second redistribution layer on a second integrated structure on the substrate, the second redistribution layer including a second contacting pattern (contact pad), thereby forming a second integrated device area; the step of separating the first and second integrated device areas along a separation line defined by at least one of the boundaries of the first integrated device area and the second integrated device area, resulting in separated first and second integrated devices; and the step of stacking the second integrated device on the first integrated device so that the first contacting pattern is uncovered by the second integrated device.

The method of the present invention has the advantage that integrated devices can be stacked together without providing a spacer or a distance element between the integrated devices in order to protect bond wires connecting respective contact pads on the surface of the integrated devices. According to the present invention, the first and the second integrated structures are provided with respective redistribution layers such that first and second integrated devices can be obtained having contacting areas located on different sides of the integrated circuit. The contacting area provides one or more contact pads to which bond wires can be attached. The first and second integrated devices are stacked on each other such that the first contacting area of the first integrated device and the second contacting area of the second integrated device are freely accessible for a contacting with bond wires and such like. As no bond wire has to be lead through a region which lies inbetween the first and second integrated device, no spacer or distance element is required in order to provide an insulation for the first and the second integrated device.

As a result of the reduced thickness of the integrated device stack, the assembly of such an integrated device stack can be carried out more quickly and the bonding process is easier to handle as the height difference between the contact pads of the first or second contacting areas to contact pads of a printed circuit board to be mounted on is decreased.

During operation, heat generated in one of the integrated devices can spread through the integrated devices of the stack so that negative degrading effects of the thermal expansion of the integrated devices can be reduced and the electrical properties of electronic circuits included in the integrated devices can be maintained similarly. Also, if heat is generated in an integrated device located in a centre position of a stack of more than two integrated devices, the heat dissipation to an outer environment can be accelerated.

According to another embodiment of the present invention, the first and the second integrated device are stacked such that the areas of the first and the second integrated structures entirely cover each other.

Furthermore, it can be provided that the second redistribution layer is provided extending beyond the area of the second integrated structure into the second kerf area, thereby forming the second integrated device area, wherein the second contacting area overlaps the second kerf area. The stacking may be performed in such a way that the areas of the first and the second integrated structures substantially cover each other entirely, wherein the step of providing the first and second redistribution layers is performed by arranging their respective contacting patterns such that the first and second redistribution layers extend on different sides of the stacked first and second integrated structures. Thereby, it can be assured that each of the contacting areas is freely accessible to a connecting process, e.g., for contacting with bond wires in a bonding process and the like.

Preferably, the separating of the first and second integrated device areas is performed using an etch separation process applied in a spacing formed between the first and second integrated device areas. The spacing can be formed by the first and the second redistribution layer which are arranged to provide edges to define a masking for the etch separation process.

In one embodiment, the second redistribution layer may extend beyond the area of the second integrated structure into a common kerf area portion, thereby forming the second integrated device area, wherein the second contacting area overlaps the common kerf area, wherein the common kerf area is defined as the area wherein the first and the second kerf areas overlap.

In another embodiment, the separating of the first and second integrated device areas is performed using a sawing process applied in the spacing formed between the first and second integrated device areas.

Preferably, a number of first and second integrated structures are provided on the single substrate such that after applying the first and second redistribution layers the lines formed by the spacings between the integrated device areas are straight.

According to an embodiment of the present invention, the provision the first and second redistribution layers are performed simultaneously using the same processing steps.

According to another aspect of the present invention, a method for producing chip stacks is provided. The production method comprises the step of manufacturing at least a first and a second integrated structure on a single substrate, an area of the first integrated structure and an area of the second integrated structure adjoining a respective first and second kerf area; the step of providing a first redistribution layer on the first integrated structure on the substrate, the first redistribution layer extending according to a first orientation beyond one or two opposing boundary lines of the area of the first integrated structure into at least a portion of the first kerf area, thereby forming a first integrated device area, wherein a first contacting pattern is arranged on the first redistribution layer in a first contacting area overlapping the first kerf area; the step of providing a second redistribution layer on the second integrated structure on the substrate, the second redistribution layer extending according to a second orientation beyond one or two opposing boundary lines of the area of the second integrated structure into the second kerf area, thereby forming a second integrated device area, wherein a second contacting pattern is arranged on the second redistribution layer in an area overlapping the second kerf area; wherein the first and the second orientation are substantially orthogonal to each other; the step of separating the first and second integrated device areas along the boundary lines defined by the first and second integrated device areas, resulting in separated first and second integrated devices; and the step of stacking the first and second integrated devices such that the first and second orientation maintain their orthogonal relation to each other.

Thus, a production method can be provided having any of the aspects mentioned above. The method is related to first and second integrated structures which are provided with respective redistribution layers extending on different sides of the integrated structures such that while stacking the integrated devices, first and second contacting areas extend from the stack on different sides, so that they are freely accessible to a contacting process.

Preferably, a number of first and second integrated structures are provided on the single substrate in such a manner that the boundary lines form straight lines extending over the surface of the substrate. This allows the separating of the first and second integrated structures using a sawing process.

According to a further embodiment of the present invention, the first and the second integrated devices are stacked so that the areas of the first and the second integrated structures cover each other entirely.

According to a preferred embodiment of the present invention, the separating of the first and second integrated device areas is performed using a etch separation process applied in a spacing formed between the first and second integrated device areas. The first and the second redistribution layers can be arranged to provide edges to define a masking for the etch separation process.

According to another aspect of the present invention, a chip stack is provided comprising: a first integrated device comprising a first integrated structure area and a first redistribution layer extending beyond the first integrated structure area, wherein a first contact pad is arranged on the first redistribution layer in a first contacting area laterally adjoining the first integrated structure area; and a second integrated device comprising a second integrated structure area and a second redistribution layer extending beyond the second integrated structure area, wherein a second contact pad is arranged on the second redistribution layer in a second contacting area laterally adjoining the second integrated structure area. The second integrated device is arranged on the first integrated device so as to form a stack wherein the first contact pad and the second contact pad are uncovered by the first and second integrated device, respectively.

Preferably, the first redistribution layer extends in a first orientation beyond two opposing sides of the first integrated structure area of the first integrated device and the second redistribution layer extends in a second orientation beyond two opposing sides of the second integrated structure area of the second integrated device. The first and the second integrated devices are arranged in such a way that the first and the second orientation are substantially orthogonal.

According to another embodiment of the present invention, a plurality of first and second integrated devices are arranged alternately such that the first integrated devices are arranged in the first orientation and the second integrated devices are arranged in the second orientation.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a top view of a substrate including integrated structures arranged with a kerf area in between;

DETAILED DESCRIPTION OF THE PREFERRED EMBODIMENT

With regard to the FIGS. 1 to 8, a first embodiment of the present invention is explained.

Figure 1:
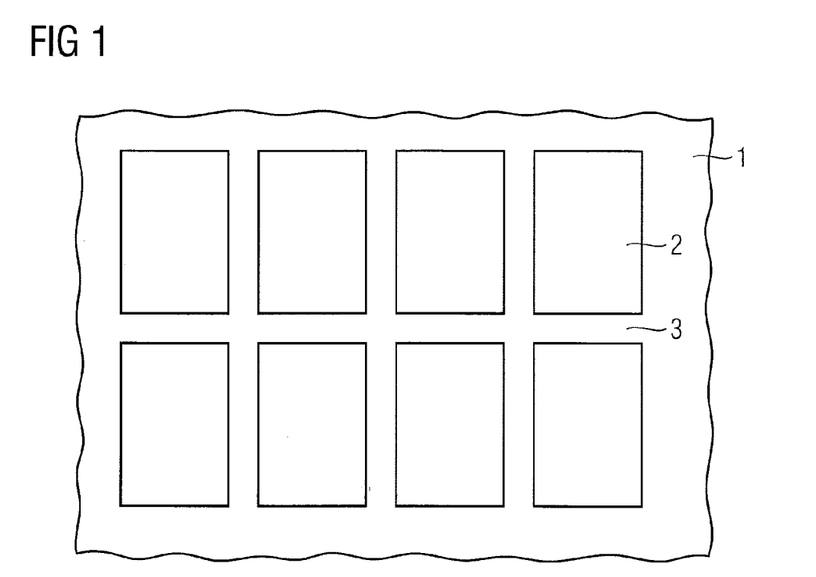

FIG. 1 shows a top view of a section of a single substrate 1 in which integrated structure areas 2 are provided. The integrated structure areas are applied in a regular arrangement. Each of the integrated structure areas is separated from a neighbored integrated structure area by a spacing which is herein called kerf area 3 as a kerf is usually located in this spacing when sawing the single substrate 1 in order to obtain separated integrated devices. The kerf area 3 normally has a width of 60 µm. Other kerf widths are possible, as well.

The integrated structure areas 2 include integrated structures, such as integrated circuits, microstructures and such like, and, hence, are also referred to herein as integrated circuit structures. Preferably, the integrated structure areas 2 each comprise the same structures, e.g. memory circuits, in one single substrate 1. The single substrate 1 may also include integrated structure areas 2 which are different in design according to the desired function of the chip stack to be built. This means that if a chip stack including two stacked integrated devices stacked is to be built, two kinds of integrated devices can be provided in the single substrate 1, a first integrated structure area and a second integrated structure area which both take over a respective functionality in the final chip stack.

In the given embodiment, the integrated structures on the single substrate 1 all have the same topology and may include memory circuits to provide a memory capacity.

After the complete processing of the integrated structures of the single substrate 1 as shown in FIG. 1, a redistribution layer 4 is provided on the surface of the single substrate 1 which include redistribution wiring to contact contact points 5 of the respective integrated circuits and to connect them to contact pads 6 located on the surface of the redistribution layer 4.

Figure 2:
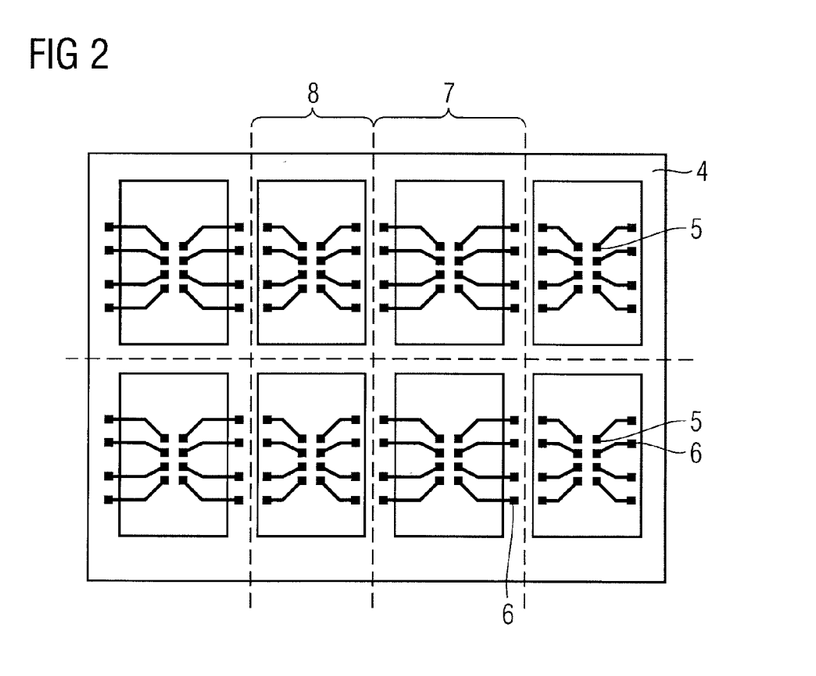
FIG. 2 shows the integrated device areas on a single substrate provided with a respective redistribution layer including contacting areas according to a method state of the first embodiment of the present invention.

Preferably, the redistribution layer 4 is applied with a planar technology e.g. a silicon technology on the surface of the single substrate to provide a redistribution wiring for each of the integrated devices. According to the embodiment of the present invention, the redistribution layer 4 may differ from one integrated structure area 2 to another integrated structure area 2 to obtain a first integrated device area 7 and a second integrated device area 8 on the wafer. The number of different redistribution layer patterns on the integrated structure area is not limited to two and can be increased depending on the number of different integrated devices to be stacked together to a chip stack. Thus, a first integrated device area 7 is obtained which has a redistribution layer 4 on the integrated structure area wherein the contact pads 6 are arranged in a contacting area which is located over or beyond the kerf area. A second integrated device area 8 is obtained by providing the redistribution layer 4 having its contact pads 6 beyond the area of the integrated structure so that the first and a second integrated device areas are defined on the single substrate 1 by providing different redistribution patterns on the identical integrated structure areas.

The redistribution layer may 4 comprise one or more metal layers (not shown) as a wiring to provide a contacting from the contact points 5 to the contact pads 6. Usually, the redistribution layer provides an insulating layer on its upper surface.

In a next step, the integrated device areas on the single substrate 1 have to be separated. This is performed by a separating process such as sawing, etching and such like, which is carried out along separation lines (dashed lines in FIG. 2).

In case of sawing, the sawing lines have to be in a size so that they do not interfere with the contacting areas beyond the kerf area of the first integrated device area 7. The width of the kerf area, the extension of the redistribution layer on the first integrated device area and the width of the sawing plate have to be matched to allow a clean and a non-destructive separation of the integrated device areas on the substrate 1.

According to another embodiment of the present invention, the separating can be performed by an etch separation process wherein within the kerf area a deep trench is etched by means of a Deep Reactive Ion Etch process (DRIE) or such like. The etching is carried out at least with a depth of the thickness of the integrated device to be produced. In order to define and to limit the trench area at the separation lines in FIG. 2, a masking is required. This masking can be achieved by providing the redistribution layer 4 on the integrated structure areas 2 such that a small gap between the first and second integrated device areas is produced where in an aperture exists in the redistribution layer 4 and wherein the surface of the substrate is uncovered.

Figure 3:
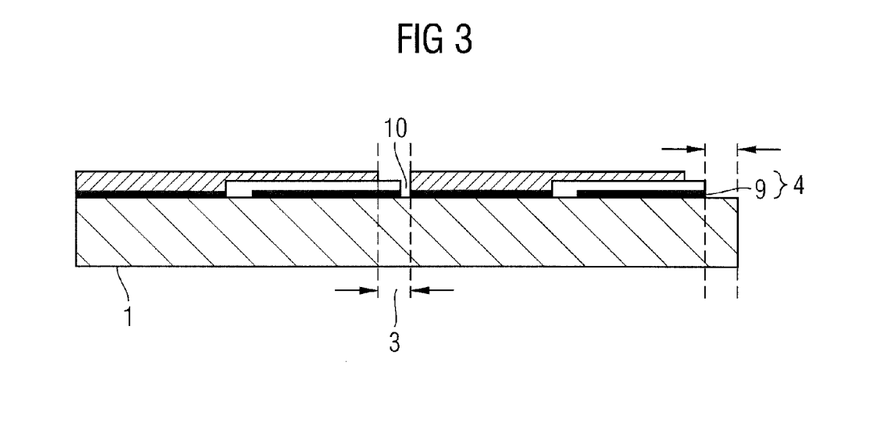
FIG. 3 shows a cross-sectional view of a wafer with integrated structures each having a redistribution layer designed to allow the appliance of a etch separation process.
Figure 4:
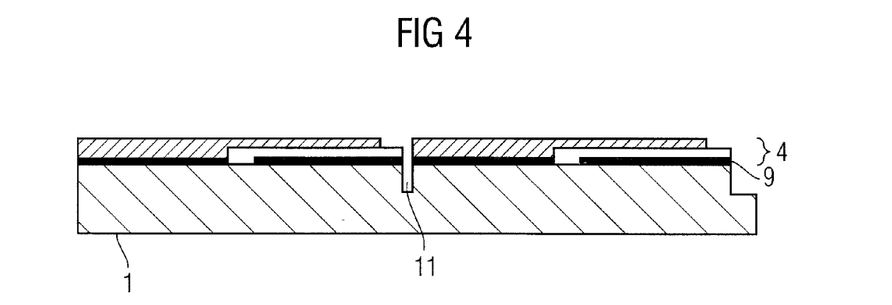
FIG. 4 shows a state after applying a deep etching process.

The redistribution layer 4 usually comprises a polyimide layer 9 which is at first deposited on the surface of the single substrate 1. The polyimide layer 9 is structured to provide openings for the contact points 5 on the integrated structure and provide openings for the separation gap 10 through which the etch process can be applied. As shown in FIG. 3, the polyimide layer 9 extends into the kerf area 3 in a portion over which the contacting area of the first integrated device is provided. The edge of the first redistribution layer portion and the edge of the second redistribution layer portion form the separation gap 10, e.g. 5 µm wide, through which the deep etch process can be applied. The width of the separation gap is not restricted and is chosen so that the etch process can be performed in the optimal manner. For etching, the use of an anisotropic etch process is preferred to avoid under-etching under the polyimide layer 10 and to produce a deep separation trench 11 with a high aspect ratio. This is shown in FIG. 4.

Figure 5:
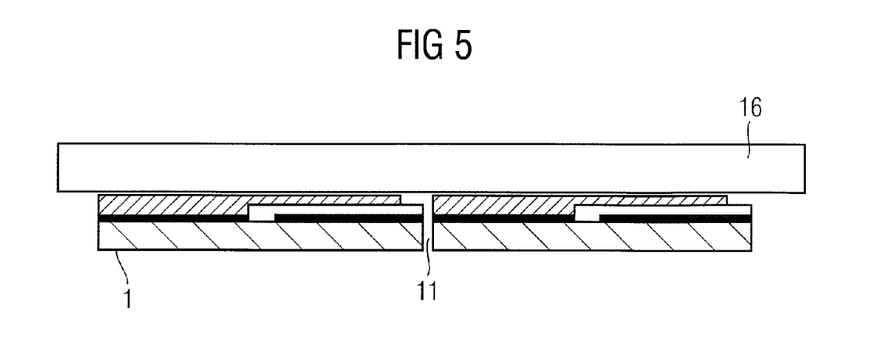
FIG. 5 shows a state after applying a backside grinding process to separate the single integrated devices.

In FIG. 5, the separation of the integrated devices is performed by attaching the substrate 1 on a grinding tape 16, e.g. by gluing and by applying an abrasive process to the backside of the substrate 1. The substrate 1 is thereby thinned at least until the bottom of the separation trench 11 is reached to separate the integrated devices. The depth of the separation trench may be e.g. 50 µm. The depth of the separation trench 11 substantially corresponds to the thickness of the integrated devices to be produced.

In the above-mentioned example, after the separation of the integrated devices two types of integrated devices, a first integrated device 13 and a second integrated device 15 are obtained.

Figure 6:
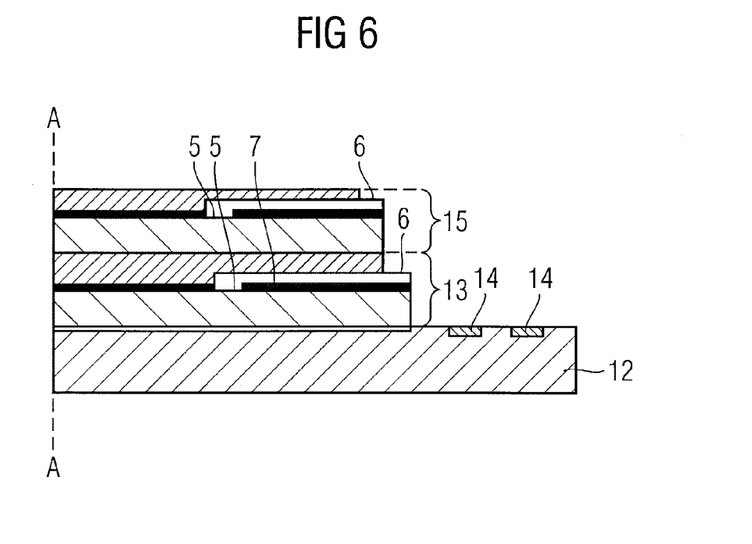
FIG. 6 shows the stacking of the integrated devices obtained by separating the integrated device areas as shown in FIG. 2.
Figure 8:
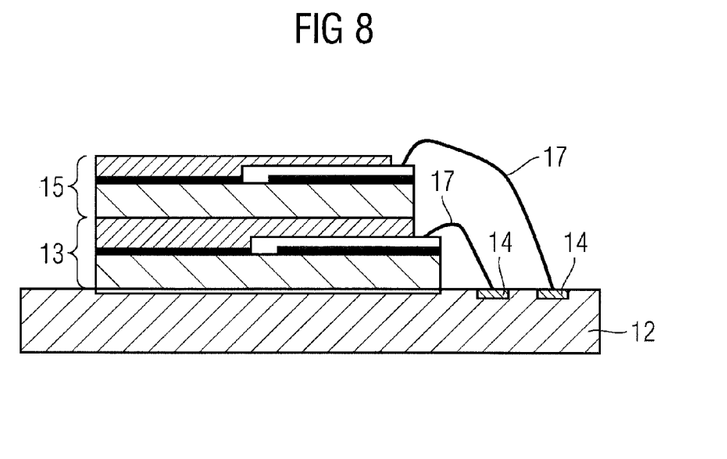
FIG. 8 shows a cross-sectional side view of the chip stack system after bonding.

In FIG. 6 the stacking of the integrated devices 13, 15 on a printed circuit board 12 is depicted. For simplicity of illustration only half of the integrated devices are shown. Illustratively, the devices are stacked with respect to a common central axis A so that the profile of the chip stack is stepped as a result of the different lateral dimensions of the respective devices (i.e., the first integrated device 13 is wider than the second integrated device 15). On the printed circuit board 12, PCB contact pads 14 for bond wires are provided and positions are defined on which the chip stack is located. The first integrated device 13 is positioned directly on the PCB and the second integrated device 15 is located above the redistribution layer 4 of the first integrated device 13, preferably without providing any spacers or distancing elements in between. The redistribution layer of the first integrated device 13 has its redistribution wiring 7 within the redistribution layer 4 so that the redistribution wiring is isolated against the surface of the first redistribution layer 4 and only the contact pads in the contacting area of the redistribution layer 4 are uncovered. As the contact pads 6 of the first integrated device 13 are positioned in the contacting area located beside the integrated structure area, the second integrated device 15 does not cover the contact pads 6 in the contacting area of the first integrated device 13. Thus, a cascaded (i.e., stepped) shape of the sidewall of the chip stack can be achieved wherein each of the contact pads 6 of the first and second integrated devices 13, 15 can be freely accessed by bond wires which are used to provide an electrical contact between the contact pads 6 of the first and second integrated device 13, 15 and the PCB contact pads 14 of the PCB, and which are provided by a bonding process step, as shown in FIG. 8.

Figure 7:
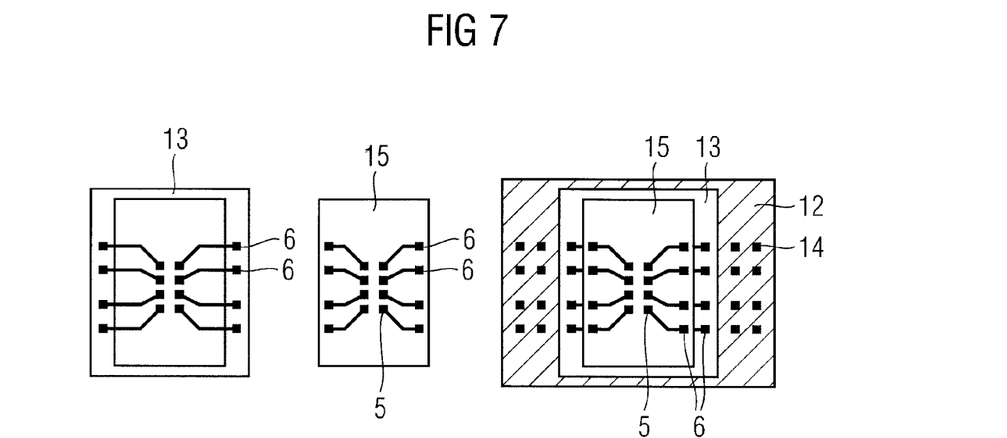
FIG. 7 shows top views of separated integrated devices and a chip stack system wherein the integrated devices are stacked and positioned on a substrate.

In FIG. 7, a top view of the separated first and second integrated devices 13, 15 as well as of the chip stack on the PCB is shown. As can be seen, the first integrated device 13 is directly attached to the PCB 12 and the second integrated device 15 is directly attached to the first integrated device 13 without covering any contact pads 6 of the redistribution layer 4 as these are in the contacting area of the integrated device area of the first integrated device 13. Thereby, by stacking the integrated devices 13, 15 onto each other, all contact pads 6 to be contacted with bond wires are freely accessible for a bonding unit and such like. Interconnecting bond wires 16 are shown in FIG. 8. As no bond wire has to be led between the first and second integrated devices 13, 15, no spacer or distancing element has to be provided in between the first and second integrated device 13, 15. The PCB 12 also includes the contact pads 14 so that the bonding of bond wires between the contact pads 14 of the PCB 12 and the contact pads 6 of the first and second integrated device 13, 15 can easily be carried out.

Figure 9:
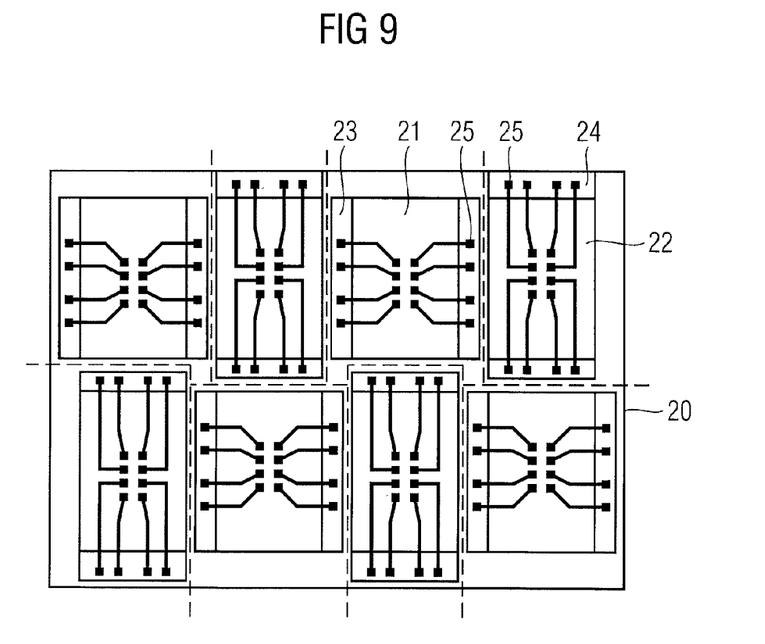
FIG. 9 shows a top view of a substrate including integrated structures with redistribution layers provided thereon having a different arrangements of contacting areas according to another embodiment of the present invention.
Figure 10:
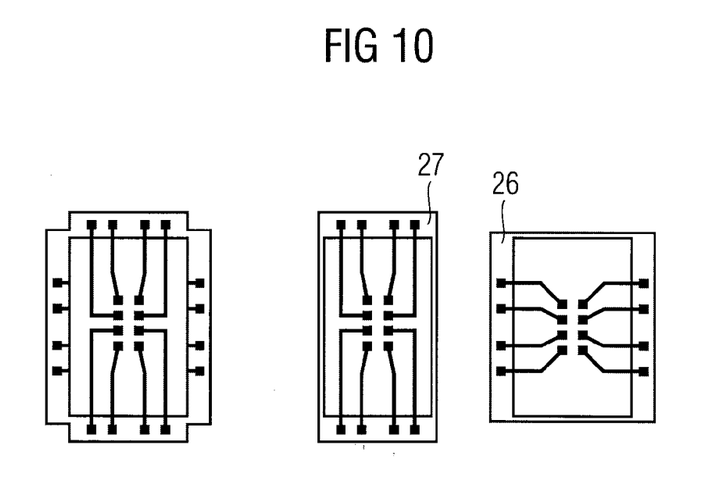
FIG. 10 shows a top view of a chip stack after separating of the integrated devices shown in FIG. 9.
Figure 11:
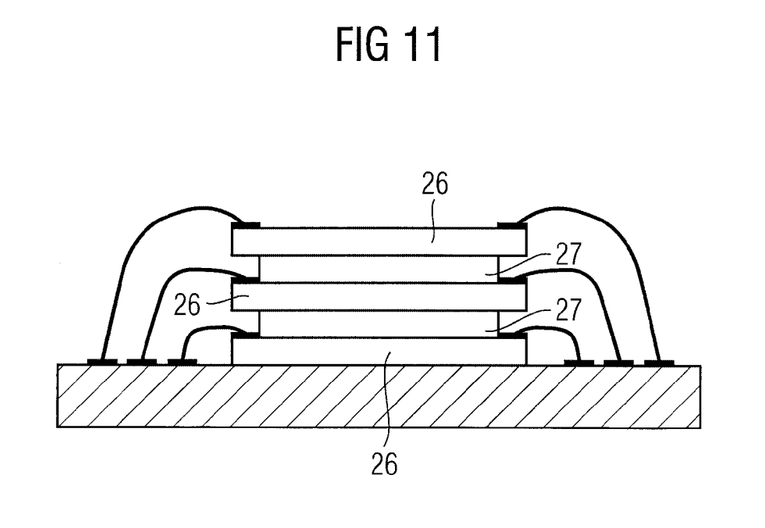
FIG. 11 shows a cross-sectional view of the chip stack of FIG. 10.

With regard to the FIGS. 9 to 11, a second embodiment of the present invention is explained. FIG. 9 shows a substrate 20 with a redistribution layer provided thereon, wherein the redistribution layer on a first integrated structure area 21 provides contact pads 25 in a first contacting area 23 which extend beyond the boundaries of the first integrated structure area 21 in a first horizontal orientation. A neighbored integrated device area includes the second integrated structure area 22 wherein the redistribution layer provides a second contacting area 24 having contact pads extending beyond the boundary of the second integrated structure area 22 in a second vertical orientation.

In the embodiment of FIG. 9, two types of integrated devices are to be produced wherein the two types of integrated device areas are preferably alternately arranged on the substrate. As the boundary of the integrated device area is not straight in this embodiment, sawing as a separation method is not appropriate, but an etch separation process can be carried out as described above with respect to the first embodiment. As explained with regard to the first embodiment, the polyimide layer and/or the redistribution layer of the first and second integrated device areas 21, 22 are patterned so that along the kerf lines a gap is formed by the edges of the polyimide layer and/or the redistribution layer of the first and second integrated device areas 21, 22 in which the surface of the underlying substrate is uncovered and through which the deep etching process can be applied.

The result of the separation of the integrated devices of the embodiment of FIG. 9 are two types of integrated devices, a first and a second integrated device 26, 27 as shown in FIG. 10, which have their contacting area not above the respective integrated structure area but laterally abutting thereto in a horizontal orientation and a vertical orientation. Thereby, the first and second integrated devices 26, 27 can comprise different geometries. While stacking the first and second integrated devices 26, 27 in an X-wise manner (FIG. 11), a chip stack is obtained which has contacting area 23, 24 extensions on all four sides providing contact pads by which the integrated devices 26, 27 of the chip stack can be contacted.

As further shown in FIG. 10, more than two integrated devices can be stacked on together, wherein first and second integrated devices 26, 27 as produced by the method explained with regard to FIG. 9 can be stacked in an alternating manner. The thickness of each of the integrated devices 26, 27 is chosen such that e.g. a bond wire contacting a first integrated circuit is not affected by a next first integrated device arranged above in the stack wherein the respective contacting areas are arranged one upon the other with a distance that equals the thickness of the second integrated device 27. When building a chip stack system as shown in FIG. 11, each of the integrated devices is separately attached and a bonding process is performed. Thereafter, a next integrated device of the chip stack is attached on the integrated device attached prior thereto, and the bonding process is repeated with the newly attached integrated device.

While the foregoing is directed to embodiments of the present invention, other and further embodiments of the invention may be devised without departing from the basic scope thereof, and the scope thereof is determined by the claims that follow.

What is claimed is:

1. A method for producing a chip stack, comprising:
manufacturing at least a first and a second integrated circuit structure on a substrate, an area of the first integrated circuit structure and an area of the second integrated circuit structure adjoining a respective first and second kerf area of the substrate;
forming a first redistribution layer on the first integrated circuit structure on the substrate, the first redistribution layer at least partially extending beyond the area of the first integrated circuit structure into the first kerf area, thereby forming a first integrated device area, wherein a first contact pad is formed by the first redistribution layer in a first contacting area overlapping the first kerf area;
forming a second redistribution layer on the second integrated rated circuit structure on the substrate, thereby forming a second integrated device area, the second redistribution layer forming a second contacting area having a second contact pad disposed therein, wherein the second redistribution layer is formed to extend beyond the area of the second integrated circuit structure into the second kerf area, thereby forming the second integrated device area, and wherein the second contact pad thereby overlaps the second kerf area;
separating the first and second integrated circuit structures along a boundary defined by the first and second kerf areas; and
stacking the separated second integrated device on the separated first integrated device so that the first contact pad remains exposed and uncovered by the second integrated device, wherein the step of stacking is performed by positioning the integrated circuit structures in like relative x-y orientation and in such a way that the areas of the first and the second integrated circuit structures substantially cover each other entirely, wherein forming the first and second redistribution layer is performed by arranging their respective contacting patterns orthogonally with respect to each other.

2. A method for producing a chip stack, comprising:
manufacturing at least a first and a second integrated circuit structure on a substrate, an area of the first integrated circuit structure and an area of the second integrated circuit structure adjoining a respective first and second kerf area of the substrate;
forming a first redistribution layer on the first integrated circuit structure on the substrate, the first redistribution layer at least partially extending beyond the area of the first integrated circuit structure into the first kerf area, thereby forming a first integrated device area, wherein a first contact pad is formed by the first redistribution layer in a first contacting area overlapping the first kerf area;
forming a second redistribution layer on the second integrated circuit structure on the substrate, thereby forming a second integrated device area, the second redistribution layer forming a second contacting area having a second contact pad disposed therein;
separating the first and second integrated circuit structures along a boundary defined by the first and second kerf areas, wherein the step of separating the first and second integrated circuit structures is performed using a etch separation process applied in a spacing formed between the first and second integrated device areas; and
stacking the separated second integrated device on the separated first integrated device so that the first contact pad remains exposed and uncovered by the second integrated device.

3. The method according to claim 2, wherein the first and the second redistribution layer are provided with a pattern which provides edges to define a masking for the etch separation process.

4. The method according to claim 3, wherein the second redistribution layer is formed to extend beyond the area of the second integrated structure into a common kerf area, thereby forming the second integrated device area, wherein the second contacting area overlaps the common kerf area; the common kerf area being defined by an area of the substrate in which wherein the first and the second kerf areas overlap.

5. A method for producing a chip stack, comprising:
manufacturing at least a first and a second integrated circuit structure on a substrate, an area of the first integrated circuit structure and an area of the second integrated circuit structure adjoining a respective first and second kerf area of the substrate;
forming a first redistribution layer on the first integrated circuit structure on the substrate, the first redistribution layer at least partially extending beyond the area of the first integrated circuit structure into the first kerf area, thereby forming a first integrated device area, wherein a first contact pad is formed by the first redistribution layer in a first contacting area overlapping the first kerf area;
forming a second redistribution layer on the second integrated circuit structure on the substrate, thereby forming a second integrated device area, the second redistribution layer forming a second contacting area having a second contact pad disposed therein;
separating the first and second integrated circuit structures along a boundary defined by the first and second kerf areas, wherein the step of separating the first and second integrated device areas is performed using a sawing process applied in a spacing formed between the first and second integrated device areas; and
stacking the separated second integrated device on the separated first integrated device so that the first contact pad remains exposed and uncovered by the second integrated device.

6. The method according to claim 5, wherein a plurality of first and second integrated structures are provided on the substrate such that, after applying the first and second redistribution layer, the lines formed by the spacings between the integrated device areas are straight.

7. A method for producing chip stacks, comprising:
manufacturing at least a first and a second integrated circuit structure on a substrate, an area of the first integrated circuit structure and an area of the second integrated circuit structure adjoining a respective first and second kerf area of the substrate and formed on opposing sides of the first and second integrated circuit structures;
forming a first redistribution layer on the first integrated circuit structure on the substrate, the first redistribution layer extending according to a first orientation beyond opposing boundaries of the area of the first integrated circuit structure into at least a portion of the first kerf area on each opposing side of the first integrated circuit structure, thereby forming a first integrated device area, wherein a first contacting pattern is formed by the first redistribution layer in a first contacting area overlapping the first kerf area, the contacting area defining an electrical contact area for connecting the first integrated circuit structure to an external electrical component;

forming a second redistribution layer on the second integrated circuit structure on the substrate, the second redistribution layer extending according to a second orientation beyond opposing boundaries of the area of the second integrated circuit structure into the second kerf area on each opposing side of the first integrated circuit structure, thereby forming the second integrated device area, wherein a second contacting pattern is formed by the second redistribution layer in an area overlapping the second kerf area; wherein the first and the second orientation are substantially orthogonal to each other;

separating the first and second integrated device areas along the boundaries defined by the first and second integrated device areas; and stacking the first and second integrated devices such that the first and second orientation maintain their orthogonal relation to each other.

8. The method according to claim 7, wherein a plurality of first and second integrated structures are provided on the substrate in such a manner that the boundaries form straight lines extending over the surface of the substrate.

9. The method according to claim 7, wherein the first and the second integrated devices are stacked so that the areas of the first and the second integrated structures cover each other entirely.

10. The method according to claim 7, wherein separating the first and second integrated device areas is performed using an etch-separation process applied in a spacing formed between the first and second integrated device areas.

11. The method according to claim 10, wherein the first and the second redistribution layer are arranged to provide edges to define a masking for the etch separation process.

12. The method according to claim 8, wherein separating the first and second integrated device areas is performed using a sawing process applied in a spacing formed between the first and second integrated device areas.

13. The method according to claim 7, wherein forming the first and second redistribution layer is done simultaneously, using the same processing steps.

14. The method according to claim 7, wherein the chip stack is attached on a printed circuit board and wherein respective contact pads of the printed circuit board and the first and second contacting patterns are wire bonded.

15. A chip stack, comprising:

a first integrated circuit defining a first integrated circuit area and a first redistribution layer formed over the first integrated circuit and extending beyond the first integrated circuit area, wherein a first contact pad is formed by the first redistribution layer in a first contacting area adjoining the first integrated structure area; and a second integrated circuit defining a second integrated circuit area and a second redistribution layer formed over the second integrated circuit and extending beyond the second integrated circuit area, wherein a second contacting pad is formed by the second redistribution layer in a second contacting area adjoining the second integrated structure area;

wherein the first and second integrated circuit structures are manufactured on a substrate having an area of the first integrated circuit structure and an area of the second integrated circuit structure adjoining a respective first and second kerf area of the substrate;

wherein the first and second integrated circuit structures are separated along a boundary defined by the first and second kerf areas:

wherein the second integrated circuit is arranged on the first integrated circuit so as to form a stack wherein the first contact pad and the second contact pads are exposed and uncovered by the first and second integrated circuits, respectively; and wherein the first redistribution layer extends in a first orientation beyond two opposing sides of the first integrated circuit area of the first integrated circuit; and wherein the second redistribution layer extends in a second orientation beyond two opposing sides of the second integrated circuit area of the second integrated circuit; wherein the first and the second integrated circuits are arranged in such a way that the first and the second orientation are substantially orthogonal.

16. A chin stack, comprising:

a first integrated circuit defining a first integrated circuit area and a first redistribution layer formed over the first integrated circuit and extending beyond the first integrated circuit area, wherein a first contact pad is formed by the first redistribution layer in a first contacting area adjoining the first integrated structure area; and a second integrated circuit defining a second integrated circuit area and a second redistribution layer formed over the second integrated circuit and extending beyond the second integrated circuit area, wherein a second contacting pad is formed by the second redistribution layer in a second contacting area adjoining the second integrated structure area;

wherein the first and second integrated circuit structures are manufactured on a substrate having an area of the first integrated circuit structure and an area of the second integrated circuit structure adjoining a respective first and second kerf area of the substrate;

wherein the first and second integrated circuit structures are separated along a boundary defined by the first and second kerf areas;

wherein the second integrated circuit is arranged on the first integrated circuit so as to form a stack wherein the first contact pad and the second contact pads are exposed and uncovered by the first and second integrated circuits, respectively; and wherein a plurality of first and second integrated circuits are arranged alternately such that the first integrated circuits are arranged in the first orientation and the second integrated circuits are arranged in the second orientation.

17. The chip stack according to claim 16, wherein the first and second integrated circuits are stacked in a crosswise manner.

18. The chip stack of claim 16, further comprising an electronic system including a printed circuit board on which the chip stack is disposed, wherein the first contact pad is wire bonded to a contact pad of the printed circuit board and wherein the second contact pad is wire bonded to another contact pad of the printed circuit board.

19. chip stack of claim 16, wherein the first and second integrated circuits form a stepped profile.

20. The chip stack of claim 18, wherein the first and second integrated circuit structures are stacked and wire bonded without need for spacers to create a sufficient gap between the first and second integrated circuit structures for the respective wire bonds.

21. The method of claim 7, wherein the stacking is done without need for spacers to create a sufficient gap between the first and second integrated circuit structures for wire bonds.

22. The method of claim 7, wherein the first and second integrated circuit structures are stacked to form a stepped profile.

23. The method of claim 7, wherein the first redistribution layer comprises a first conducting member coupling the first contact pad to a respective inner contact pad formed at an inner region of the first integrated circuit structure and wherein the second redistribution layer comprises a second conducting member coupling the first contact pad to a respective inner contact pad formed at an inner region of the first integrated circuit structure.

* * * * *